(12) United States Patent
Gyouten et al.

(10) Patent No.: US 6,426,467 B1
(45) Date of Patent: Jul. 30, 2002

(54) FILM CARRIER WITH ADJACENT ELECTRICAL SORTING PADS

(75) Inventors: Seijirou Gyouten, Tenri; Shunichi Murahashi, Nabari, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/376,368

(22) Filed: Aug. 18, 1999

(30) Foreign Application Priority Data

Aug. 20, 1998 (JP) .......................................... 10-234757

(51) Int. Cl.[7] ................................................ H05K 1/16
(52) U.S. Cl. ........................ 174/260; 174/261; 361/768
(58) Field of Search ................................. 361/767, 768, 361/771, 773, 776, 783; 174/260; 257/737, 738, 780

(56) References Cited

U.S. PATENT DOCUMENTS 5,012,213 A * 4/1991 Tsai ........................... 333/247

FOREIGN PATENT DOCUMENTS

JP          6104316        4/1994
JP          8105926        4/1996

OTHER PUBLICATIONS

Taiwanese Document No. 85103800 (translation) to Micron Technology, Inc. Apr. 1997, pp. 1–21 and 4 sheets of drawings.
Translation of Taiwanese document 85103800 which appears to be Micron Technology Inc, docket No. 92–182.4, 1995, pp. 1,3,5,7,9,11,13,15,17,19,21 and figures 2,2A–2D, 4,5,5A.

* cited by examiner

Primary Examiner—Kamand Cuneo

(57) ABSTRACT

A film carrier tape includes: an insulating film; a plurality of lead terminals that are each disposed on the insulating film and provided with an end connected to a semiconductor chip; and electrical sorting pads disposed at another end of each of the plurality of lead terminals, wherein at least some of the electrical sorting pads are configured so as to form pad groups each composed of two or more of the electrical sorting pads, and the electrical sorting pads composing each of the pad groups are positioned adjacent to one another so as to simultaneously contact a measurement terminal of a tester and so as to be electrically separated from one another.

13 Claims, 18 Drawing Sheets

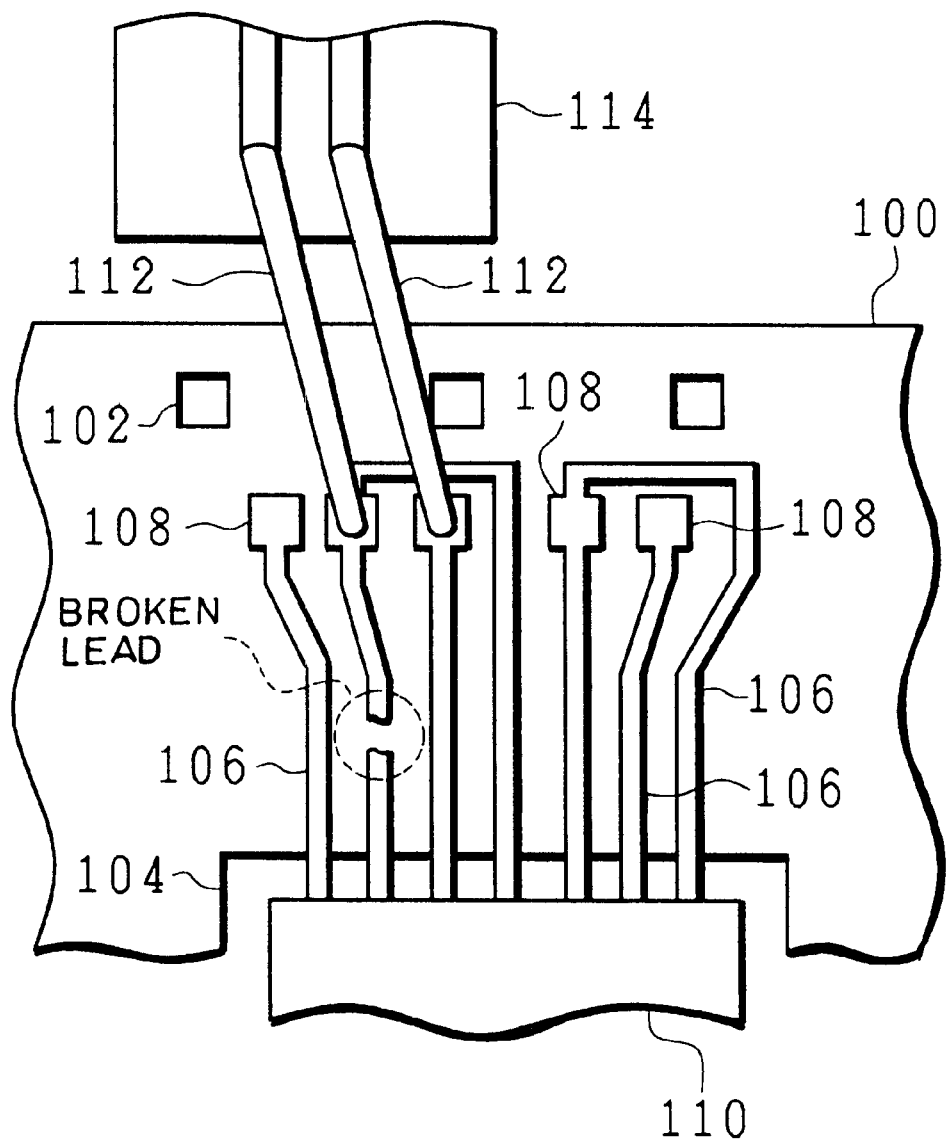

FILM CARRIER WITH ADJACENT ELECTRICAL SORTING PADS

FIELD OF THE INVENTION

The present invention relates to film carrier tapes, especially, to film carrier tapes used in a tape carrier bonding (Tape Automated Bonding) process and methods of evaluating the film carrier tapes.

BACKGROUND OF THE INVENTION

Conventional film carrier tapes have a plurality of lead terminals with an end thereof being connected to a semiconductor chip and the other end being provided with an electrical sorting (screening) pad.

FIG. 13 is a schematic plan view showing a conventional film carrier tape. An insulating film 100 has sprocket holes 102 formed along both sides thereof for transport and positioning purposes. Also, the insulating film 100 has in the middle thereof semiconductor chip mounting holes 104 where semiconductor chips are mounted. Further, the insulating film 100 is provided thereon with a plurality of lead terminals 106 each extending over the semiconductor chip mounting hole 104 at one end thereof, while an electrical sorting pad 108 is formed at the other end of each of the lead terminals 106.

Demands on the semiconductor chip for higher integrity and high performance in recent years have resulted in the semiconductor chip having more input and output terminals (bonding pads on the semiconductor chip) and hence more lead terminals 106. Therefore, the pitches are decreasing between the lead terminals 106. As a result, the pitches between the lead terminal 106 of a film carrier tape are in some cases smaller than the smallest pitch required to provide the electrical sorting pad 108.

Therefore the electrical sorting pads 108 of such a film carrier tape are configured as shown in FIG. 14 for example: the electrical sorting pads 108 are disposed along a zigzag line.

However, the region of the insulating film (not shown) where the electrical sorting pads 108 are formed is unnecessary and cut off along line III—III shown in FIG. 14 when the semiconductor chip is mounted on the insulating film. The zigzag configuration of the electrical sorting pads 108 shown in FIG. 14 increases the area of the region of the insulating film where the electrical sorting pads 108 are formed. In other words, a larger portion of the insulating film is wasted. This results in less packages (semiconductor chips) being mounted on the film carrier tape, and hence higher production costs. Besides, the tester cannot be equipped with an enough number of lead probes (measurement terminals) to match the increased number of the electrical sorting pads 108.

To solve these problems, FIG. 15 suggests a film carrier tape of which adjacent lead terminals 106 share a single electrical sorting pad 108.

The film carrier tape having such electrical sorting pads 108 can accommodate more lead terminals 106 without additional electrical sorting pads 108; thereby a smaller portion of the insulating film 100, which will be cut off along line IV—IV shown in FIG. 16, is wasted. Apart from that, the film carrier tape uses a smaller number of electrical sorting pads 108 and can be configured so that the number of the electrical sorting pad 108 matches the number of lead probes of a conventional tester.

However, with the film carrier tape shown in FIG. 16, a short circuit cannot be detected which possibly occurs between adjacent lead terminals 106 that commonly share an electrical sorting pad 108.

To solve those problems, Japanese Laid-Open Patent Application No. 6-104316/1994 (Tokukaihei 6-104316, published on Apr. 15, 1994) discloses a film carrier tape shown in FIG. 17. The film carrier tape has lead terminal groups each consisting of one or more lead terminals 106, and a common electrical sorting pad 108 is formed for each lead terminal group. This configuration enables detection of short circuits between adjacent lead terminals 106.

However, the film carrier tape shown in FIG. 17 disenables the detection of broken conductivity of the lead terminal 106 belonging to a lead terminal group when a delivery inspection (an inspection before delivery of the film carrier tape from the production line) is conducted in the manufacturing process of the film carrier tape on which no semiconductor chip is yet mounted.

FIG. 18 shows an example of delivery inspection conducted in the manufacturing process of the film carrier tape to detect a broken lead terminal 106. In the delivery inspection, the lead terminals 106, extending over the semiconductor chip mounting hole 104, are caused to commonly contact an electrode plate 110, whereas the electrical sorting pads 108 are caused to contact the lead probes 112 of a tester. A broken lead terminal 106 is detected by the securing card 114 of the tester confirming electrical conductivity between the lead probes 112 to the electrode plate 110.

The tester therefore comes short of detecting the broken lead terminal 106 belonging to the lead terminal group shown encircled by broken lines in FIG. 19 for example, since the electrical sorting pad 108 of that lead terminal group is electrically connected to the electrode plate 110 as long as the other lead terminal 106 of the same lead terminal group is in good conditions. The film carrier tape thus passes the delivery inspection, and the defect is not found until an electrical sorting process after semiconductor chips are mounted, which inevitably leads to greater production cost.

SUMMARY OF THE INVENTION

The present invention has an object to offer film carrier tapes, and methods of evaluating thereof, capable of curbing increase in production cost that would otherwise results from increased use of film materials and reducing the number of measurement terminals required by a tester used for an inspection after the mounting of semiconductor chips as well as detecting all broken lead terminals in a delivery inspection conducted in the manufacturing process of the film carrier tapes.

In order to accomplish the above object, the film carrier tape in-accordance with the present invention includes:

a plurality of lead terminals that are each disposed on an insulating film and provided with an end connected to a semiconductor chip and another end having an electrical sorting pad, wherein the electrical sorting pads of two or more of the plurality of lead terminals that are not adjacent to one another are electrically separated from one another and configured so that electrical sorting can be simultaneously conducted thereon through the two or more of the plurality of lead terminals.

With the above arrangement, in a delivery inspection to detect broken conductivity of a lead terminal which is conducted in the manufacturing process of a film carrier tape before a semiconductor chip is mounted, an electrode plate or the like is caused to commonly contact the ends of the lead terminals which will be connected to the semiconductor chip. Subsequently, electric connection (conductivity) is confirmed between the electrode plate and the electrical sorting pads provided at the other ends of the lead terminals to detect broken conductivity of each lead terminal individually.

If the film carrier tape is such that two or more lead terminals share a single electrical sorting pad, those lead terminals are connected electrically parallel to one another between the electrical sorting pad and the electrode plate. The parallel configuration of the lead terminals allows conductivity to be detected between the electrical sorting pad and the electrode plate even if one or some of the parallel lead terminals is/are broken. In other words, broken conductivity is not detected unless all the lead terminals are broken. In such a case, the film carrier tape passes the delivery inspection, and the defect is not found until an electrical sorting process after a semiconductor chip is mounted, which inevitably leads to greater production cost.

To tackle the problems, according to the present invention, the electrical sorting pads of two or more of the lead terminals that are not adjacent to one another are configured so as to allow a broken conductivity inspection to be conducted on each lead terminal individually. Therefore, the lead terminals are not connected electrically parallel to one another between the electrical sorting pad and the electrode plate. Hence, if at least one lead terminal is broken among the two or more of the lead terminals that are not adjacent to one another, conductivity is not detected, i.e., broken conductivity is detected.

After a semiconductor chip is mounted, electrical sorting is conducted on the lead terminals. With the foregoing arrangement, the electrical sorting pads of two or more of the lead terminals that are not adjacent to one another are configured so that electrical sorting can be simultaneously conducted thereon through those lead terminals. Therefore, electrical sorting can be simultaneously conducted on the electrical sorting pads through the lead terminals. The electrical sorting pads thus function as a single electrical sorting pad. This is in practice equivalent to a reduction in the number of electrical sorting pads, and allows a reduction in the number of measurement terminals of a tester used in an electrical sorting process after the mounting of a semiconductor chip. Also, this holds down expansions of the area in which electrical sorting pads are disposed, and thereby effectively avoids increased production cost which would be otherwise caused by increased use of material of the insulating film.

For a fuller understanding of the nature and advantages of the invention, reference should be made to the ensuing detailed description taken in conjunction with the accompanying drawings.

BRIEF DESCRIPTION OF THE DRAWINGS

FIG. 19 is an enlarged view showing the lead terminal section of the film carrier tape shown in FIG. 17 in a case that one of the lead terminals is broken.

DESCRIPTION OF THE EMBODIMENTS

Referring to figures, the following description will explain embodiments in accordance with the present invention.

Figure 1:
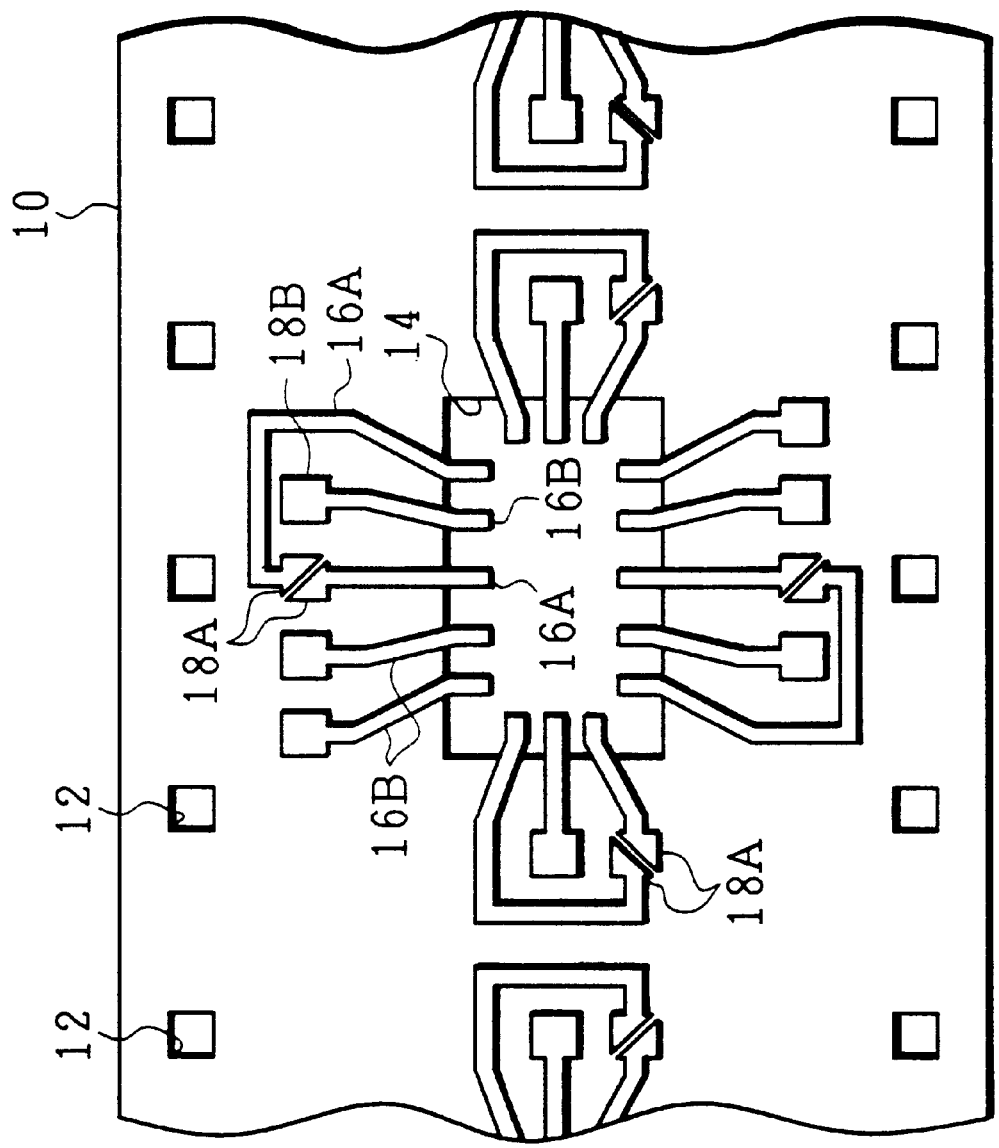
FIG. 1 is a plan view showing a film carrier tape of an embodiment in accordance with the present invention.

The film carrier tape of the present invention has, as shown in FIG. 1, a plurality of sprocket holes 12 formed along both sides of an insulating film 10 in the longitudinal direction of the insulating film 10 for transport and positioning purposes. Also, the insulating film 10 has, substantially in the middle thereof, rectangular semiconductor chip mounting holes 14 with the longer sides thereof extending in the longitudinal direction of the insulating film 10.

Further, the insulating film 10 is provided thereon with a plurality of lead terminals 16A and 16B each extending over the semiconductor chip mounting hole 14 at one end thereof, while either an electrical sorting pad 18A or 18B is formed at the other end thereof. The plurality of lead terminals 16A and 16B electrically connect, at one of the ends thereof, connection terminals of a semiconductor chip to the film carrier tape. The electrical sorting pads 18A and 18B are for electrically sorting (screening) the lead terminals 16A and 16B.

Each two electrical sorting pads 18A form a pad group. The two electrical sorting pads 18A forming each pad group are positioned adjacent to each other so as to simultaneously contact a single probe (measurement terminal) 22 (shown in FIG. 3) of a tester (electrical sorting tester) and also so as to be electrically separated from each other.

The electrical sorting pad 18A, forming a half of the pad group, is disposed for every two lead terminals 16A and 16B. Specifically, the lead terminal 16B, connected to the electrical sorting pad 18B that is independent, i.e., that does not belong to a pad group, is interposed between every two lead terminals 16A connected to the electrical sorting pads 18A forming the pad group.

Figure 2:
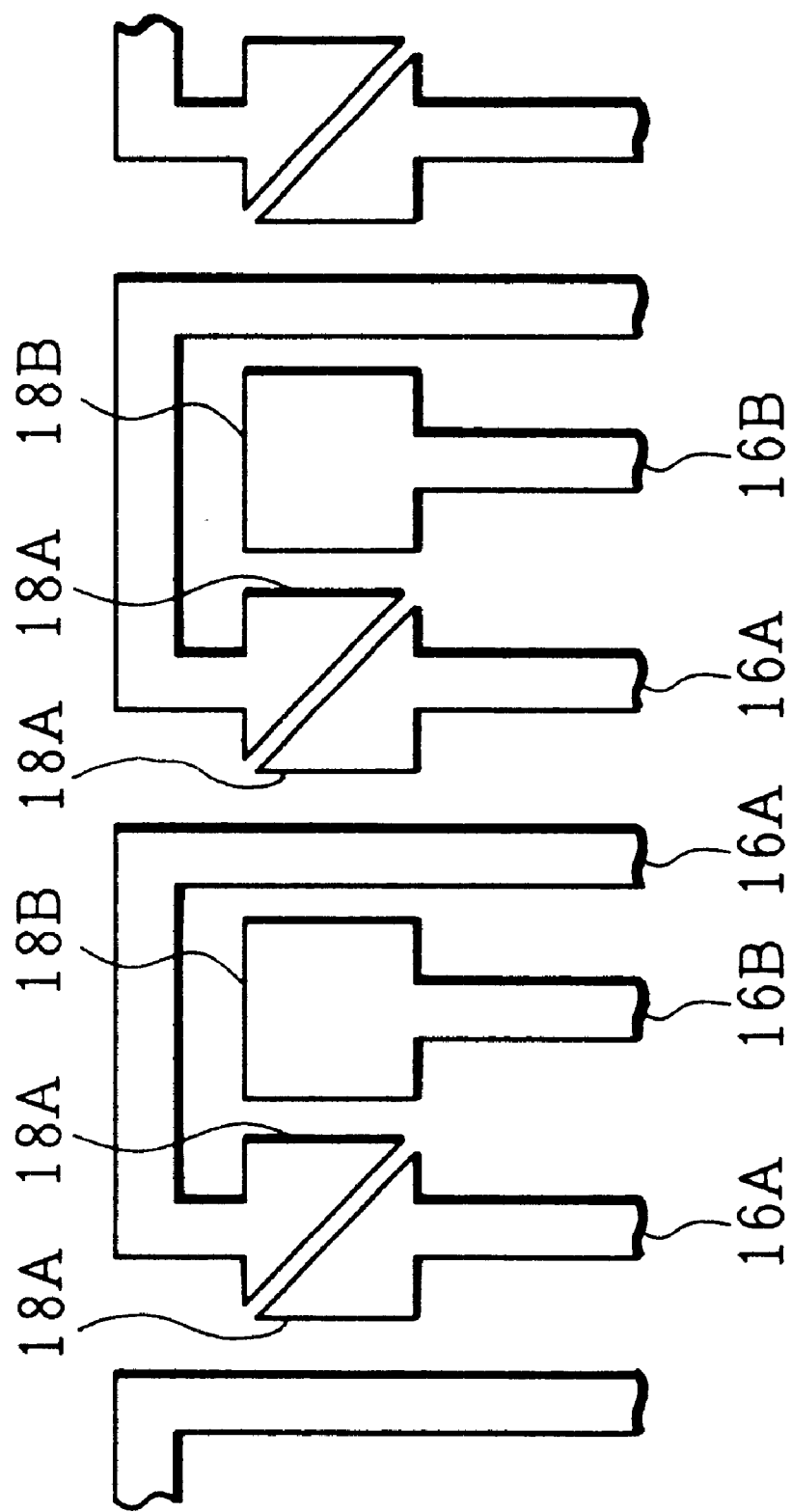
FIG. 2 is an enlarged view showing an electrical sorting pad section of the film carrier tape shown in FIG. 1.

FIG. 2 is an enlarged view showing a vicinity of the electrical sorting pads 18A and 18B of the film carrier tape shown in FIG. 1. As shown in FIG. 2, the distance between the two electrical sorting pads 18A that are positioned adjacent to each other so as to form a single pad group is preferably as short as possible so as to simultaneously contact the lead probe 22 (shown in FIG. 3) of the tester in an electrical sorting process conducted after the mounting of the semiconductor chip. In other words, the distance between the electrical sorting pads 18A that are positioned adjacent to each other so as to form a single pad group is preferably set to the smallest value possible as long as such a value allows the fabrication of a conductive pattern on the insulating film 10.

The area of the electrical sorting pad 18A is preferably set to the smallest value possible as long as, in a delivery inspection conducted in the manufacturing process of the film carrier tape, such a value allows a lead probe 26 (shown in FIG. 6) of a tester (broken conductivity inspection tester) to contact only one of the electrical sorting pads 18A that are positioned adjacent to each other so as to form a single pad group.

Moreover, in this example, the two electrical sorting pads 18A that are positioned adjacent to each other so as to form a single pad group have a (right-angled) isosceles triangle shape, and when viewed including the space separating the two, have the same shape (i.e., square shape) and area as the electrical sorting pad 18B.

Figure 3:
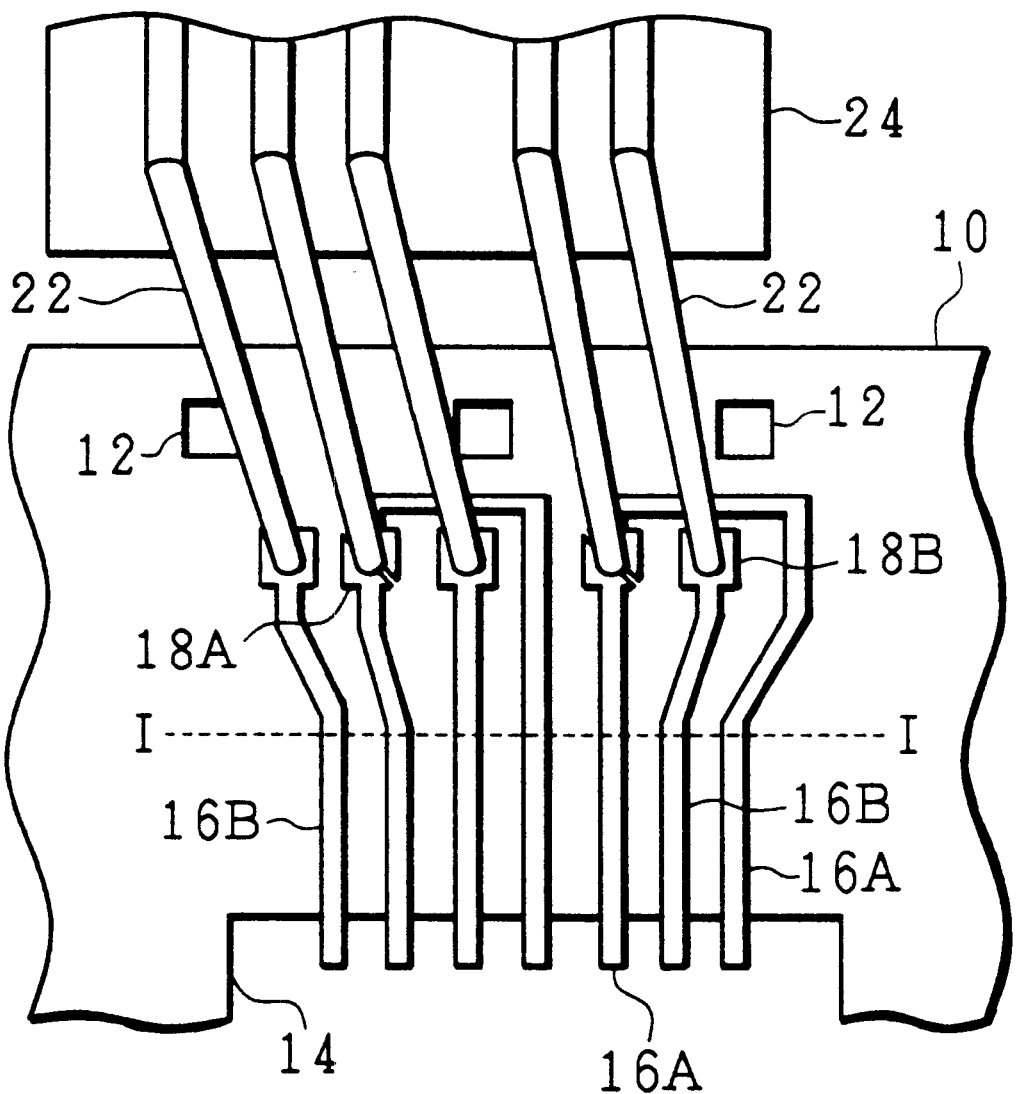
FIG. 3 is an explanatory view illustrating an embodiment of electrical sorting of the film carrier tape shown in FIG. 1 conducted after the mounting of a semiconductor chip, or more specifically an enlarged view showing a lead terminal section of the film carrier tape.

Next, referring to FIG. 3, the following description will explain, as an example, an electrical sorting process conducted after the mounting of semiconductor chips. FIG. 3 is a plan view showing the lead probes 22 of the tester brought into contact with the electrical sorting pads 18A and 18B of the film carrier tape shown in FIG. 1. Also, in FIG. 3, a vicinity of the lead terminals 16A and 16B of the film carrier tape shown in FIG. 1 is enlarged.

First, a semiconductor chip (not shown) is mounted in a region corresponding to the semiconductor chip mounting hole 14, the semiconductor chip is electrically connected at desired input and output terminals thereof to the ends of the lead terminals 16A and 16B.

Subsequently, as shown in FIG. 3, the lead probes 22 of the tester (not shown) are caused to contact the electrical sorting pads 18A and 18B. This enables the tester to transmit a predetermined inspection signal from a securing card 24 through the lead probes 22 to the lead terminals 16A and 16B. For the signal transmission, the lead probes 22 are positioned so as to simultaneously contact the two electrical sorting pads 18A that are positioned adjacent to each other to form a single pad group. Then the tester electrically sorts the lead terminals 16A and 16B depending on whether or not a predetermined inspection signal is passed. After the completion of the electrical sorting, the insulating film 10 is cut off along, for example, line I—I shown in FIG. 3.

The semiconductor chip (not shown) mounted on the film carrier tape configured as above preferably allows the bonding pad (input and output terminal) to assume two states, i.e., an enabled state (conductive state) and a disenabled state (non-conductive state). Mounting such a semiconductor chip allows electrical sorting to be conducted even if the semiconductor chip has more input and output terminals than the lead probes 22.

Examples of such a semiconductor chip, the input and output terminals of which assumes the enabled and disenabled states, include semiconductor chips that allow the input and output terminals thereof to assume a high impedance state (open state) by deactivating an input and output buffer and also to assume a low impedance state (operational state) by activating that input and output buffer. The following description will explain, as an example, procedures of electrical sorting conducted by the semiconductor chip.

First, the input and output terminals of the semiconductor chip (not shown) are connected to the lead terminals 16A and 16B. Subsequently, the lead probe 22 is caused to simultaneously contact the two electrical sorting pads 18A that are positioned adjacent to each other to form a single pad group. Subsequently, the input and output terminal of the semiconductor chip corresponding to the lead terminal 16A to be inspected, i.e., one of the two lead terminals 16A connected to the respective electrical sorting pads 18A that are in contact commonly with the single lead probe 22, is selectively changed to a low impedance state (conductive state), while the other input and output terminal is selectively changed to a high impedance state (non-conductive state).

By doing this, the inspection signal transmitted from the tester (not shown) is fed only to the input and output terminal that is in a low impedance state. The operation is conducted for each of the lead terminals 16A that are in contact commonly with the single lead probe 22.

Here, it should be noted that the aforementioned description referred to the lead terminals 16A being connected to the input and output terminal of the semiconductor chip. However, the same description remains true with a case where the lead terminals 16A are connected to an input terminal or an output terminal of the semiconductor chip, and therefore no further description is given here to illustrate such a case.

Figure 4:
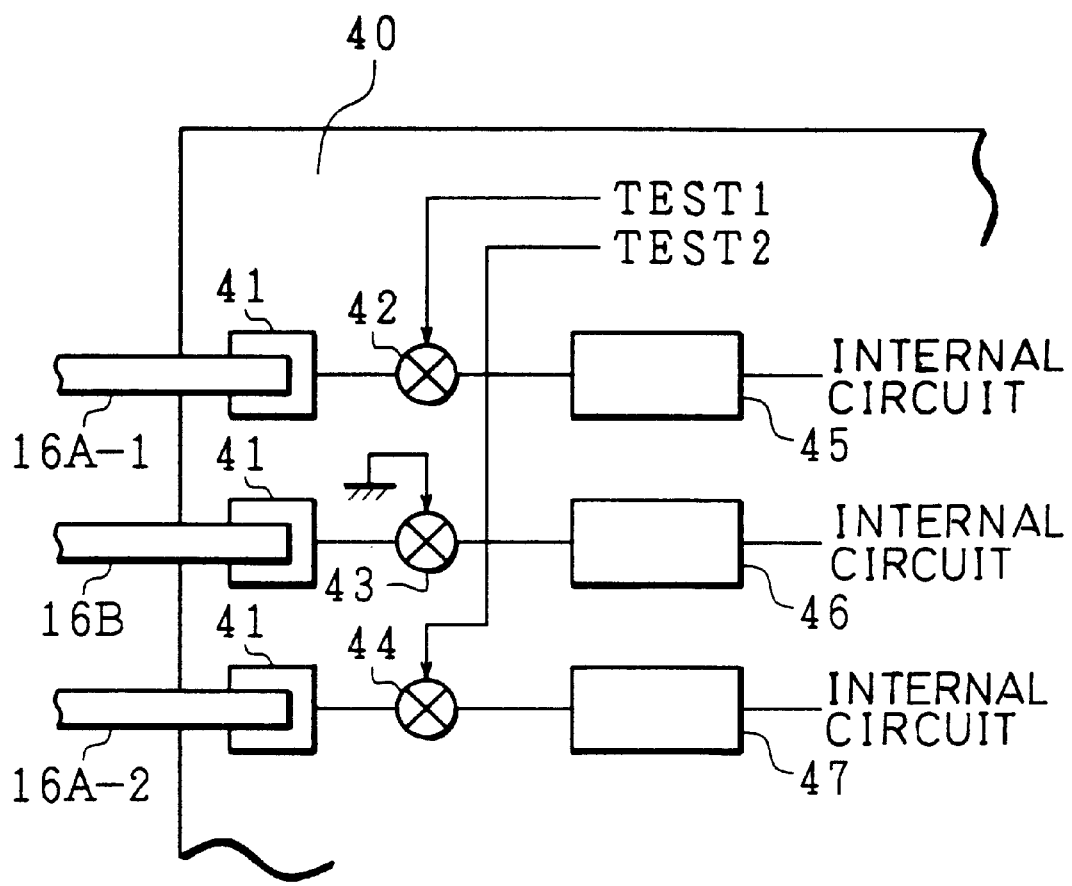
FIG. 4 is a schematic circuit diagram showing, as an example, an evaluation circuit used on the semiconductor chip side in accordance with the present invention.

Referring to FIG. 4, the following description will explain, as an example, an evaluation circuit used on the semiconductor chip side in accordance with the present invention.

As shown in FIG. 4, a semiconductor chip 40 used in accordance with the present invention includes electrode pads 41 connected to lead terminals 16A-1, 16A-2, and 16B of the film carrier tape, buffers 45 to 47 for externally transmitting signals to and from internal circuits (not shown) of the semiconductor chip 40, and evaluation switches 42 to 44 each interposed between the electrode pad 41 and one of the buffers 45 to 47.

The lead terminal 16A-1 and the lead terminal 16A-2 are connected to respective electrical sorting pads 18A (shown in FIG. 3) that form a single pad group. Further, the lead terminal 16B is connected to an independent electrical sorting pad 18B (shown in FIG. 3).

Analogue switches are used to act as the switches 42 to 44 in this example. An evaluation signal TEST1 is coupled to a control signal input terminal of the switch 42, whereas an evaluation signal TEST2 is coupled to a control signal input terminal of the switch 44. The control signal input terminal of the switch 43 is grounded. Here, it should be noted that the buffers 45 to 47 may be input buffers, output buffers, or input and output buffers.

The following description will explain an electrical sorting process conducted after the mounting of the semiconductor chip, using the evaluation circuit configured as above.

First, as shown in FIG. 3, the lead probe 22 of the tester is caused to contact the substantially central part of the pad group composed of two electrical sorting pads 18A and also to contact the substantially central part of the electrical sorting pad 18B. Here, the two electrical sorting pads 18A forming the pad group simultaneously contact the lead probe 22 and thus become electrically connected with each other via the lead probe 22.

Subsequently, if the lead terminal 16A-1 shown in FIG. 4 is to be inspected, the evaluation signal TEST1 is set to "Low" and the evaluation signal TEST2 is set to "High".

Figure 5:
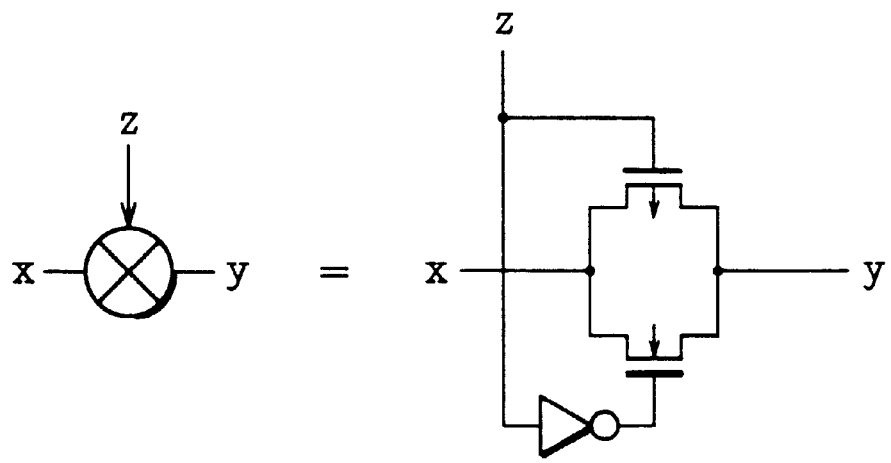
FIG. 5 is a circuit diagram showing a circuit arrangement of an analogue switch of the evaluation circuit shown in FIG. 4.

The switches 42 to 44 are analogue switches configured as shown in FIG. 5. These analogue switches are arranged so that if a "Low" signal is coupled to a control signal input terminal z, the input terminal x is connected to the output terminal y, and if a "High" signal is coupled to the control signal input terminal z, the input terminal x is disconnected from the output terminal y.

Consequently, by the aforementioned settings of the evaluation signals TEST1 and TEST2, the lead terminal 16A-1 and the buffer 45 change to a connected state, and the operation of the internal circuit corresponding to the lead terminal 16A-1 is evaluated. Further, since the analogue switch 43 is always in an ON state, the adjacent lead terminal 16B and buffer 46 change to a connected state. Hence, the operation of the internal circuit corresponding to the lead terminal 16B, a short circuit between the lead terminal 16A-1 and the lead terminal 16B, and broken conductivity of the lead terminal 16A-1 and the lead terminal 16B are simultaneously evaluated. Here, the lead terminal 16A-2 and the buffer 47, since being in a cut-off state, do not affect the foregoing evaluations.

Here, it should be noted that the foregoing evaluation signals TEST1 and TEST2 may be generated internally by the semiconductor chip 40, or may be fed externally to the semiconductor chip 40 via bonding pads.

Subsequently, if the lead terminal 16A-2 is to be inspected, the evaluation signal TEST1 is set to "High" and the evaluation signal TEST2 is set to "Low". By these settings, the lead terminal 16A-2 and the buffer 47 change to a connected state, and the operation of the internal circuit corresponding to the lead terminal 16A-2 is evaluated. Further, since the adjacent lead terminal 16B and buffer 46 are in a connected state, the operation of the internal circuit corresponding to the lead terminal 16B, a short circuit between the lead terminal 16A-2 and the lead terminal 16B, and broken conductivity of the lead terminal 16A-2 and the lead terminal 16B are simultaneously evaluated. Here, the lead terminal 16A-1 and the buffer 45, since being in a cut-off state, do not affect the foregoing evaluations.

By conducting these evaluations, the operation of the lead terminals 16A and 16B, a short circuit between adjacent lead terminals 16A and 16B, and broken conductivity of the lead terminals 16A and 16B are all evaluated.

Here, it should be noted that, in the evaluation circuit example, the analogue switch 43 is always ON so as to enable precise impedance matching between the lead terminals 16A and 16B. Therefore, the analogue switch 43 may be omitted in an application example where no precise impedance matching needs to be conducted between the lead terminals 16A and 16B.

Further, in the evaluation circuit example, the analogue switches 42 to 44 were used as switching elements; however, the analogue switches 42 to 44 are not required if the buffers 45 to 47 inside the semiconductor chip 40 are replaced for tri-state buffers (buffers capable of assuming three states: namely, a "High" state, a "Low" state, and a high impedance state). If the buffers 45 to 47 inside the semiconductor chip 40 are replaced for tri-state buffers, in order to conduct the aforementioned evaluation to inspect the lead terminal 16A-1, the tri-state buffer corresponding to the lead terminal 16A-2 should be set to a high impedance state. Also, in order to conduct the aforementioned evaluation to inspect the lead terminal 16A-2, the tri-state buffer corresponding to the lead terminal 16A-1 should be set to a high impedance state.

Figure 6:
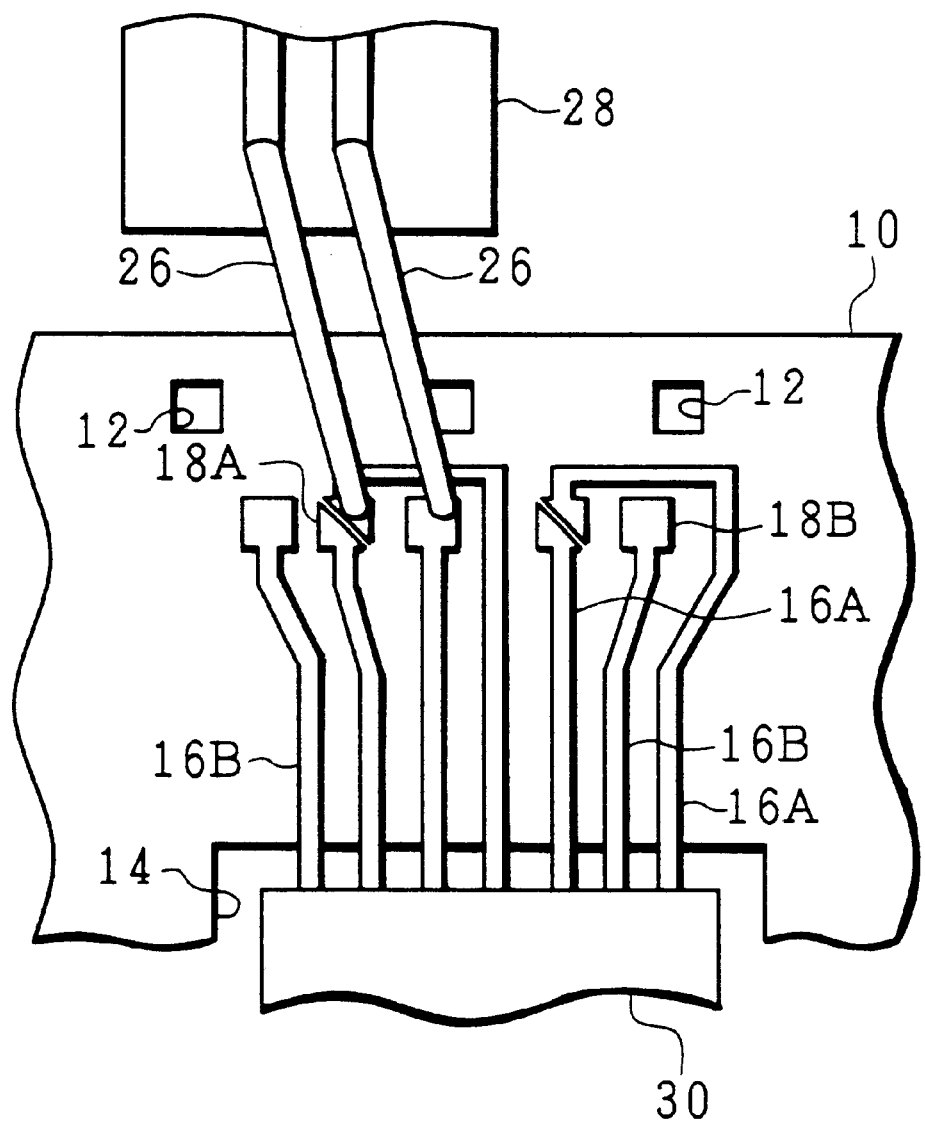
FIG. 6 is an explanatory view illustrating an embodiment of delivery inspection conducted in the manufacturing process of the film carrier tape shown in FIG. 1, or more specifically an enlarged view showing a lead terminal section of the film carrier tape.

FIG. 6 shows, as an example, a delivery inspection conducted in the manufacturing process of the film carrier tape of the present embodiment.

First, an electrode plate 30 is connected to the lead terminals 16A and 16B extending over the semiconductor chip mounting hole 14. Further, the lead probes 26 of the tester are caused to contact respectively with the electrical sorting pad 18B and only one of the electrical sorting pads 18A forming a single pad group. Then, by confirming the electric connection between the electrode plate 30 and the lead probes 26 of the tester through the securing card 28 and the lead probes 26 of the tester, a delivery inspection is conducted for broken conductivity of the lead terminals 16A and 16B. The two electrical sorting pads 18A, although being positioned adjacent to each other to form a single pad group, are electrically separated from each other, and not connected. The electrical sorting pads 18A thus allow a broken conductivity inspection to be conducted on each of the lead terminals 16A separately from the other lead terminal 16A.

As detailed so far, the film carrier tape of the present invention is such that the electrical sorting pads 18A form pad groups, and the electrical sorting pads 18A forming a single pad group are positioned adjacent to each other so as to simultaneously contact the lead probe 22 of the tester and so as to be electrically separated from each other.

With the above arrangement, by causing the lead probe 22 of the tester to simultaneously contact the electrical sorting pads 18A forming a single pad group in an inspection conducted after the mounting of semiconductor chips, an electrical sorting can be conducted simultaneously on a plurality of lead terminals 16A. Therefore, a tester can handle an electrical sorting process with less lead probes, thereby overcoming potential lack of lead probes as a result of an increased number of the lead terminals 16A and 16B. Consequently, no elements, such as relays, need to be interposed between a tester (not shown) and a securing card 24 to compensate for the lack of lead probes. The successful elimination of need for relays and other elements maintains high inspection performance and reliability of the tester in the defect detection process.

Further, since the electrical sorting pads can practically be reduced in number, the electrical sorting pads occupy a smaller area on the insulating film 10. In other words, the film-carrier-type semiconductor device having a semiconductor chip mounted on a film carrier tape can cut down on the area that is not essential for the operation thereof, and more packages can be thereby mounted occupying an equal area of the insulating film 10. Consequently, it becomes possible to offer a less expensive film carrier tape by using a smaller insulating film, and to manufacture film-carrier-type semiconductor devices at a lower cost.

Further, since the electrical sorting pads 18A forming a single pad group are electrically separated from each other, in a delivery inspection conducted in the manufacturing process of the film carrier tape, broken conductivity of the lead terminals 16A and 16B can be all detected by causing the lead probe 26 of the tester to contact one of the electrical sorting pads 18A forming a single pad group.

Apart from that, since adjacent lead terminals 16A and 16B are not connected to each other, a short circuit can be detected between the adjacent lead terminals 16A and 16B.

Figure 7:
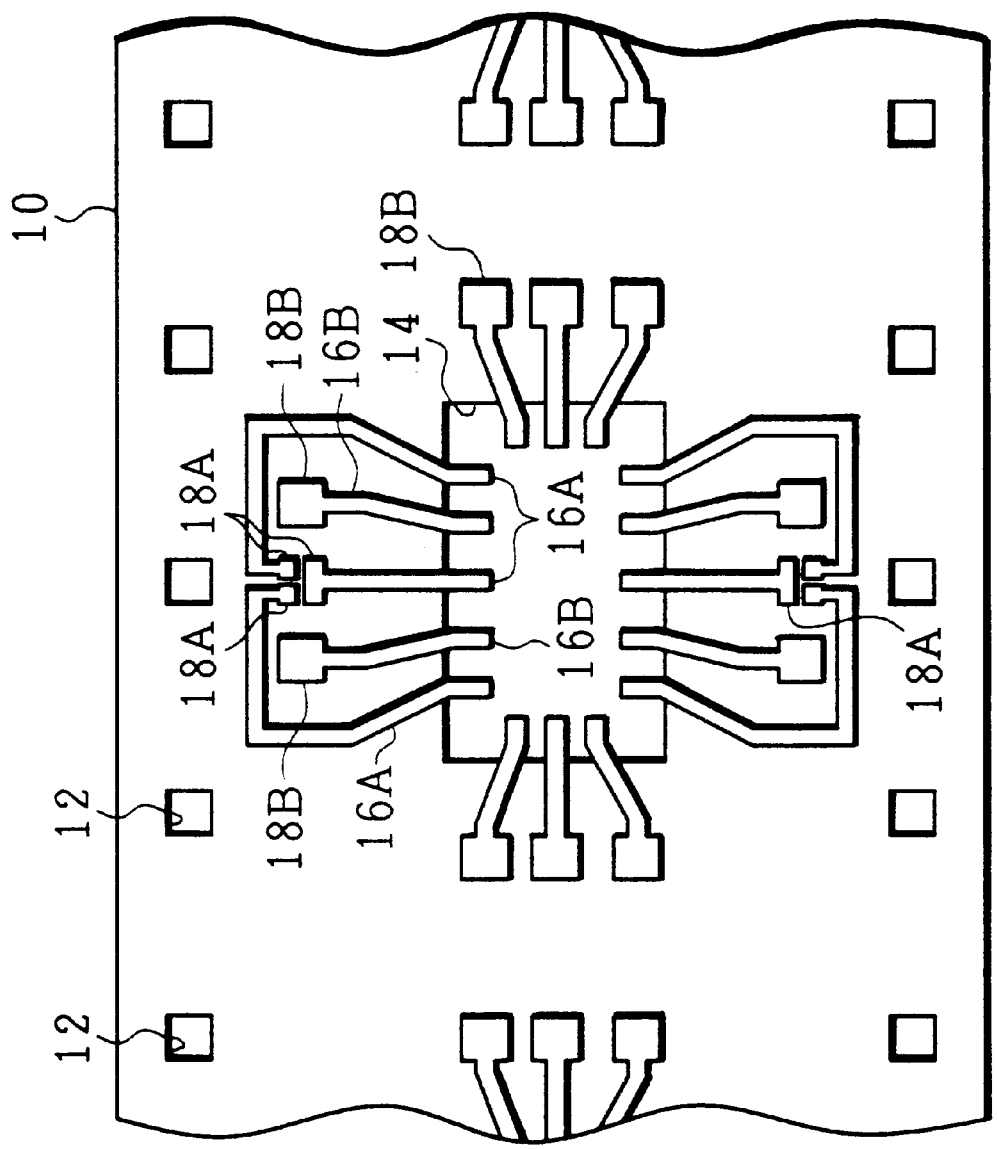
FIG. 7 is a plan view showing a film carrier tape of another embodiment in accordance with the present invention.

Here, it should be noted that in the embodiment as shown in FIG. 1, the pad group was composed of two electrical sorting pads 18A; however, the pad group may be composed of three or more electrical sorting pads 18A. FIG. 7 shows a plan view of a film carrier tape having pad groups each being composed of three electrical sorting pads 18A as an example. Drawing illustrating pad groups each being composed of four or more electrical sorting pads 18A are omitted here.

Figure 8:
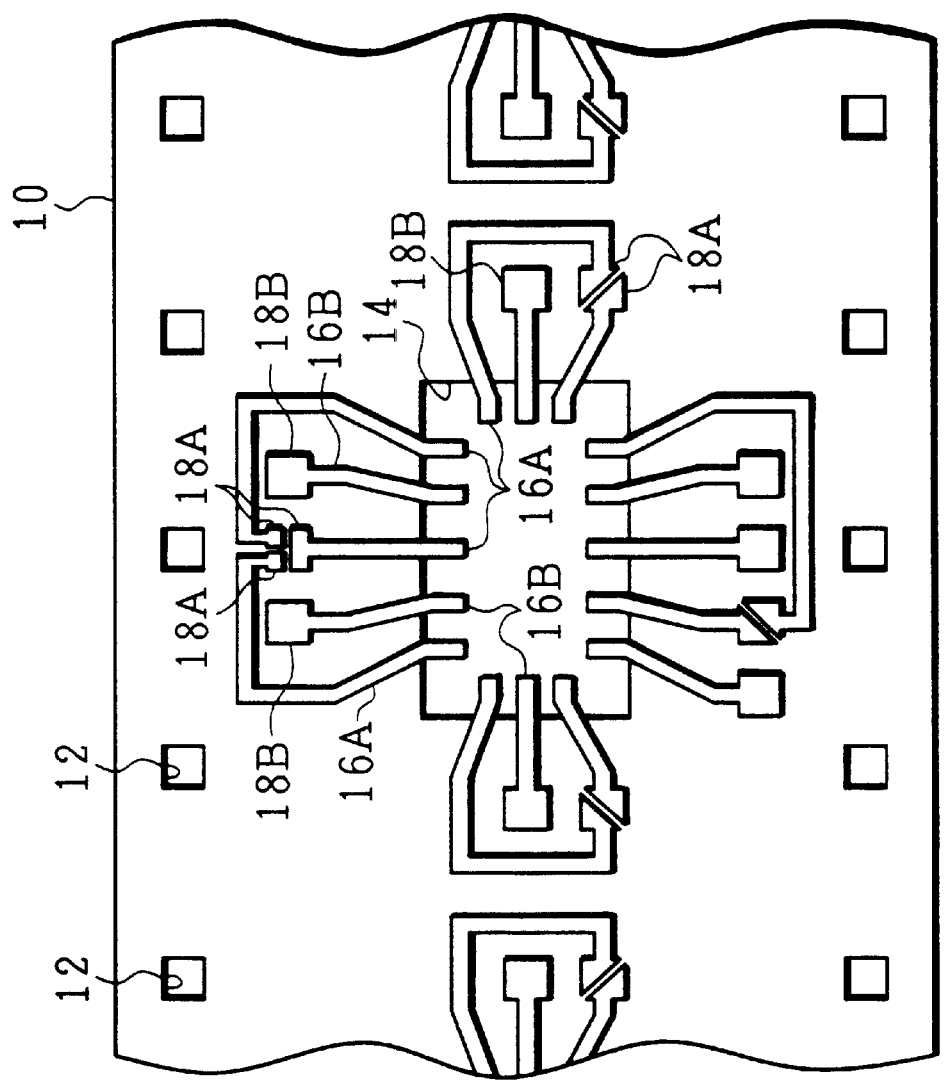
FIG. 8 is a plan view showing a film carrier tape of even another embodiment in accordance with the present invention.

Alternatively, the number of electrical sorting pads 18A composing the pad group may vary from one pad group to another on a single film carrier tape. Further, not only one lead terminals 16B, but two or more of them, may be interposed between the lead terminals 16A connected to the respective electrical sorting pads 18A forming a single pad group. Alternatively, the number of lead terminals 16B interposed between the lead terminals 16A may vary on a single film carrier tape. FIG. 8 is a plan view showing an embodiment of a film carrier tape such that the pad groups are composed of either two or three electrical sorting pads 18A, and one or two lead terminals 16B are interposed between the lead terminals 16A connected to the electrical sorting pads 18A forming a single pad group.

A conventional tester can be used for electrical sorting without increasing the number of the lead probes thereof, by adjusting, as mentioned above, the number of electrical sorting pads 18A forming a pad group, and the number of lead terminals 16B interposed between the lead terminals 16A connected to the grouped electrical sorting pads 18A.

Figure 9:
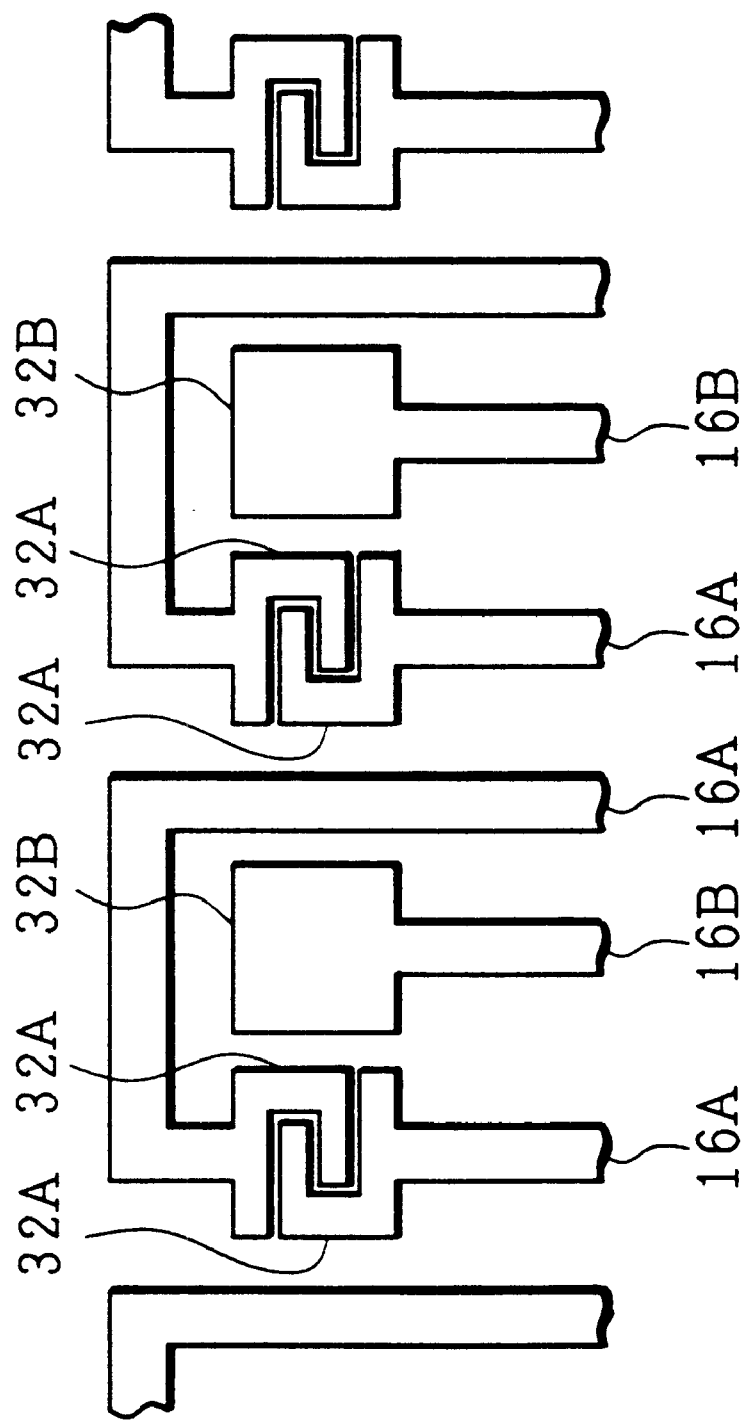
FIG. 9 is a plan view showing an electrical sorting pad section of a film carrier tape of a further embodiment in accordance with the present invention.

Alternatives to the electrical sorting pads 18A and 18B shown in FIG. 2 acting as electrical sorting pads forming pad groups include electrical sorting pads 32A of a comb-like shape and electrical sorting pads 32B of a square shape as shown in the enlarged view of FIG. 9, where the electrical sorting pads 32A interlock the teeth thereof to form pad groups, and the electrical sorting pads 32B are independent.

This arrangement increases, in each pad group, the portions of an electrical sorting pad 32A which are in a close proximity of the other electrical sorting pad 32A, and allows the lead probe 22 of the tester to better simultaneously contact the electrical sorting pads 32A. Consequently, simultaneous electrical sorting is conducted on a plurality of lead terminals 16A with higher precision.

Figure 10:
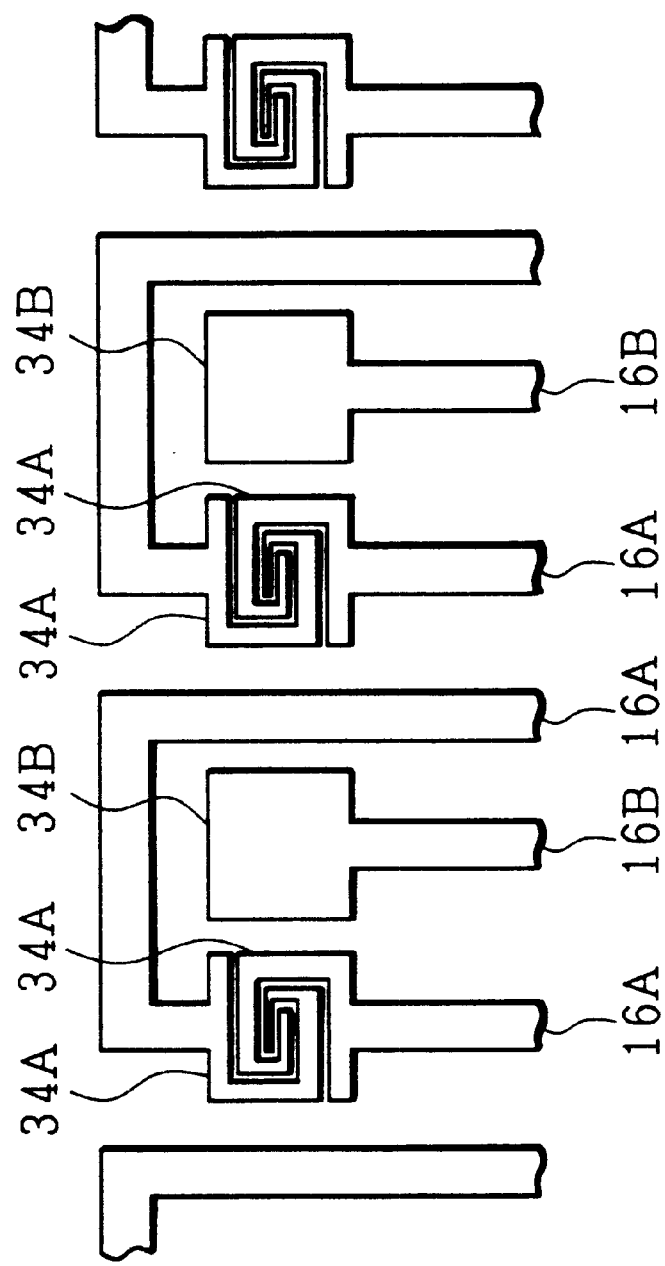
FIG. 10 is a plan view showing an electrical sorting pad section of a film carrier tape of an even further embodiment in accordance with the present invention.

Further alternatives to the electrical sorting pads 18A shown in FIG. 2 acting as electrical sorting pads forming pad groups may include electrical sorting pads 34A of a spiral shape and electrical sorting pads 34B of a square shape as shown in the enlarged view of FIG. 10, where the electrical sorting pads 34A form pad groups of a double spiral shape and the electrical sorting pads 34B are independent.

This arrangement increases, in each pad group, the portions of an electrical sorting pad 32A which are in a close proximity of the other electrical sorting pad 32A, and allows the lead probes 22 of the tester to better simultaneously contact the electrical sorting pads 32A. Consequently, simultaneous electrical sorting is conducted on a plurality of lead terminals 16A with higher precision and accuracy.

By employing the comb-shaped electrical sorting pads 32A or spiral electrical sorting pads 34A, the lead probes 22 of the tester better (more surely) contact the electrical sorting pads 32A or 34A in a electrical sorting process conducted using the tester.

Here, it should be noted that apart from the shapes shown in FIG. 9 and FIG. 10, there are more alternatives to the shape of the electrical sorting pads that are useful in enhancing the contact of the lead probes 22 to the electrical sorting pads to conduct electrical sorting using a tester having those probes. However, detailed descriptions are omitted here.

Further, an electrical sorting pad having a shape, not like that shown in FIG. 9 or FIG. 10, but like that of the electrical sorting pad 18A shown in FIG. 2 for example, provide a region where the measurement terminal of a tester can contact the electrical sorting pad without contacting other electrical sorting pads. Specifically, the electrical sorting pads 18A forming a single pad group have a right-angled isosceles triangle shape, and provide a region where the lead probe of a tester can contact one of the electrical sorting pads 18A without contacting the other, adjacent, electrical sorting pad 18A.

Therefore, by using electrical sorting pads having a similar shape to that of the electrical sorting pad 18A, the tester shown in FIG. 6, i.e., a tester having lead probes 26, is capable of conducting a broken conductivity inspection on each of the lead terminals 16A connected to the electrical sorting pads 18A forming a single pad group, etc., separately from the rest of the lead terminals 16A as part of a delivery inspection in the manufacturing process of the film carrier tape.

By contrast, by using the electrical sorting pads 32A shown in FIG. 9 or the electrical sorting pads 34A shown in FIG. 10, the tester shown in FIG. 6, i.e., a tester having lead probes 26, is not capable of conducting a broken conductivity inspection on each of the lead terminals 16A connected to the electrical sorting pads 32A or 34A forming a single pad group, separately from the rest of the lead terminals 16A as part of a delivery inspection of the manufacturing process of the film carrier tape.

However, in recent years, a non-contact tester has been developed which is capable of conducting non-contact delivery inspection without using lead probes to establish contacts. Such a non-contact tester is disclosed, for example, in Japanese Laid-Open Patent Application No. 8-105926/1996 (Tokukaihei 8-105926, published on Apr. 23, 1996). According to the Application, the non-contact tester is a wire pattern inspection device that includes non-contact voltage detection means having electro-optic elements which changes the optical properties thereof by the application of an electric field. The wire pattern inspection device detects broken conductivity of the wire pattern by applying a voltage to an end of the wire pattern and detecting the other end of the wire pattern with the non-contact voltage detection means in a non-contact manner.

Even if the electrical sorting pads 32A shown in FIG. 9 or the electrical sorting pads 34A shown in FIG. 10 are used, the non-contact tester is capable of conducting a broken conductivity inspection on each of the lead terminals 16A connected to the electrical sorting pads 32A or 34A forming a single pad group, separately from the rest of the lead terminals 16A as part of a delivery inspection of the manufacturing process of the film carrier tape.

In the foregoing embodiments of film carrier tapes, no specifications were given regarding relative positioning of the electrical sorting pads (18A, 32A, and 34A) in a pad group, or in other words, how the pad group is divided. Delivery inspection can be conducted on the film carrier tape of the foregoing embodiments in the manufacturing process of the film carrier tape without any problems by means of the lead probes 26 (shown in FIG. 6) of the tester used for delivery inspection conducted in the manufacturing process of the film carrier tape, only if the inspection is done such that every one or more of the electrical sorting pads (18A, 32A, or 34A) on the insulating film 10 are probed separately from the other electrical sorting pads by the lead probe 26 of the tester.

However, problems arise, when the relative positioning of the electrical sorting pads (18A, 32A, and 34A) in a pad group differ from one pad group to another, if the lead probes 26 of the tester used for delivery inspection conducted in the manufacturing process of the film carrier tape is such that some of the electrical sorting pads (18A and 18B, 32A and 32B, and 34A and 34B) are probed simultaneously by means of a tester having many lead probes 26 secured on the securing card 28 according to the coordinates of the electrical sorting pads (18A and 18B, 32A and 32B, and 34A and 34B) on the insulating film 10.

Figure 11:
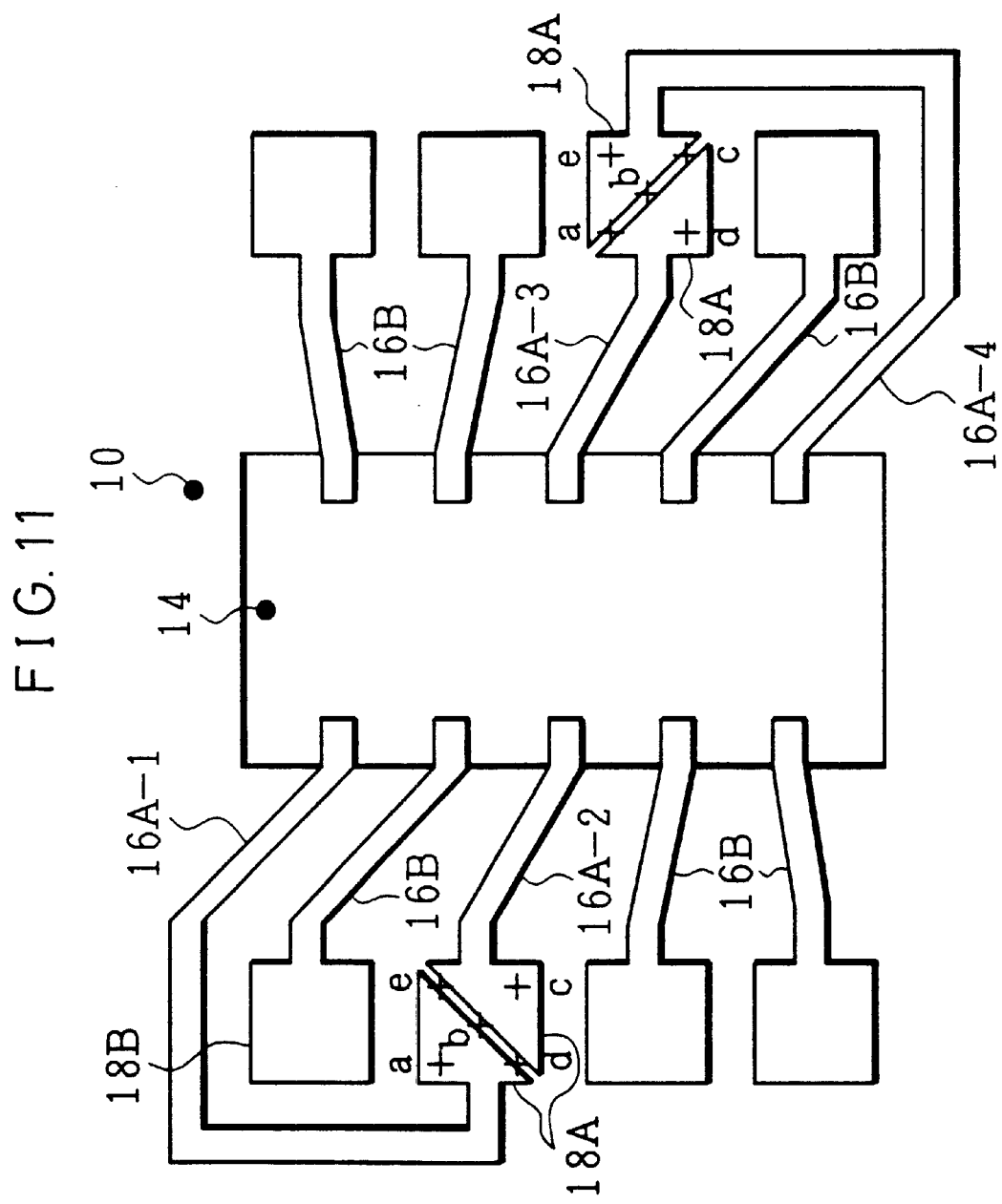
FIG. 11 is a plan view showing a film carrier tape of still another embodiment in accordance with the present invention.

Specifically, as shown in FIG. 11, the following problems entail when the relative positioning of the electrical sorting pads 18A in a pad group differ from one pad group to another. For example, it is supposed that, in order to evaluate each of the lead terminals 16A-1 and the lead terminals 16A-2 that are connected to electrical sorting pads 18A forming one of the pad groups for possible broken conductivity, the lead terminal 16A-1 is first probed with the coordinates of the point a as the target and evaluated for broken conductivity, and the lead terminal 16A-2 is subsequently probed with the coordinates of the point c as the target and evaluated for broken conductivity.

Here, attention should be paid to the lead terminal 16A-3 and the lead terminal 16A-4 that are connected to electrical sorting pads 18A forming another pad group: the lead terminal 16A-3 and the lead terminal 16A-4 will be connected to each other via the lead probes 26, and therefore, the lead terminal 16A-3 and the lead terminal 16A-4 cannot be evaluated separately for broken conductivity regardless whether the point a or the point c is taken as the target in the probe. Hence, a further probe is needed with the point d and the point e as the targets to evaluate the lead terminal 16A-3 and the lead terminal 16A-4 separately for broken conductivity, which adds another step to the inspection process and results in higher inspection costs.

Figure 12:
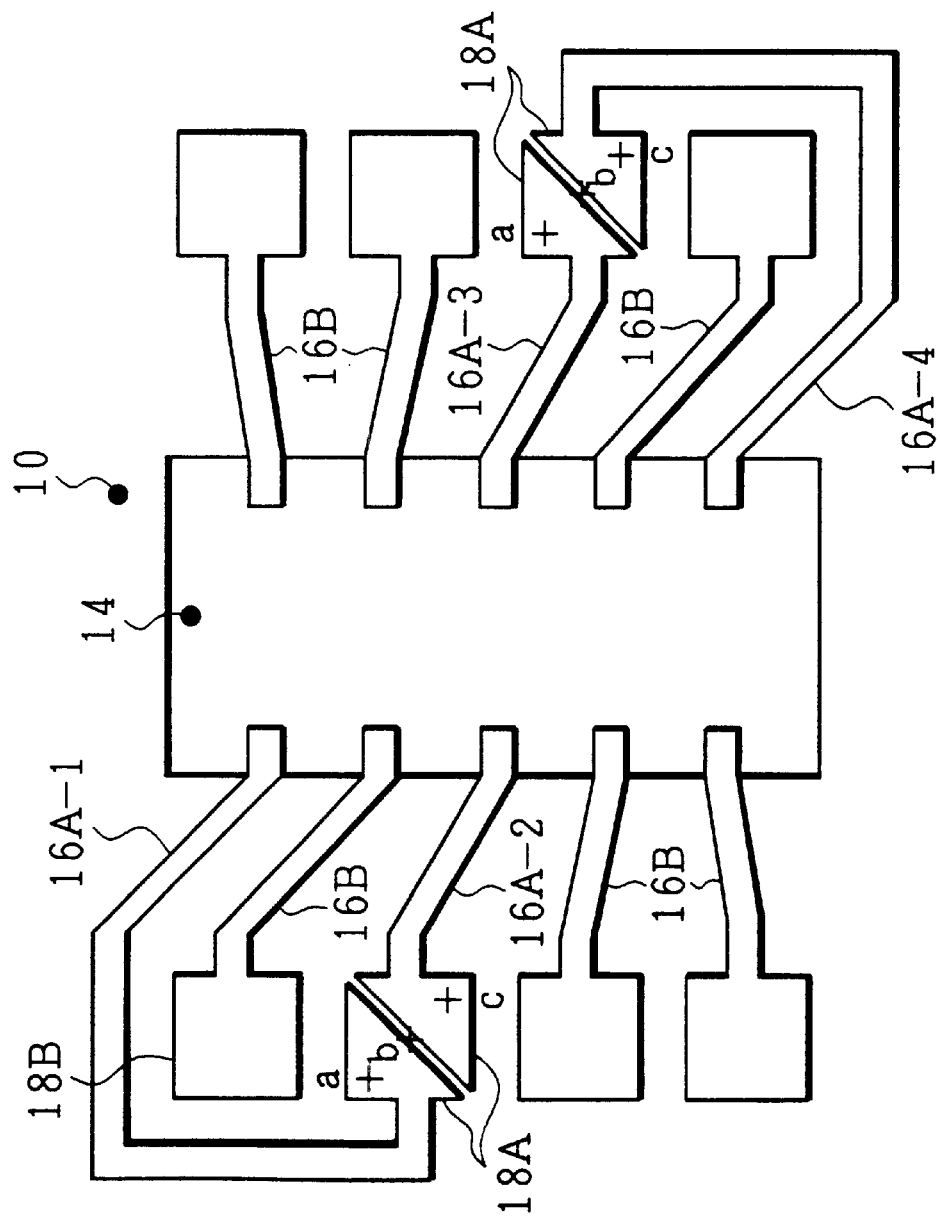
FIG. 12 is a plan view showing a film carrier tape of even another embodiment in accordance with the present invention.
Figure 13:
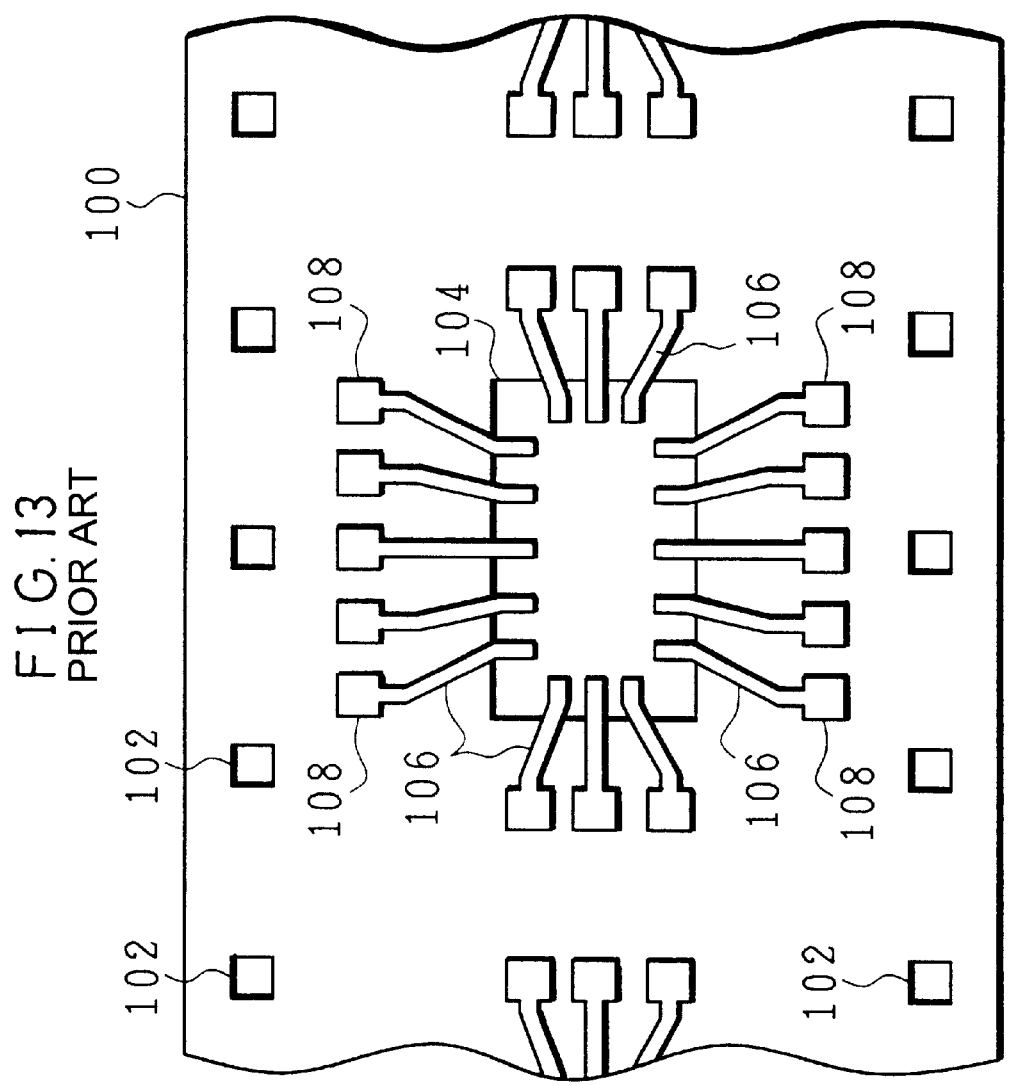
FIG. 13 is a plan view showing a first conventional film carrier tape.
Figure 14:
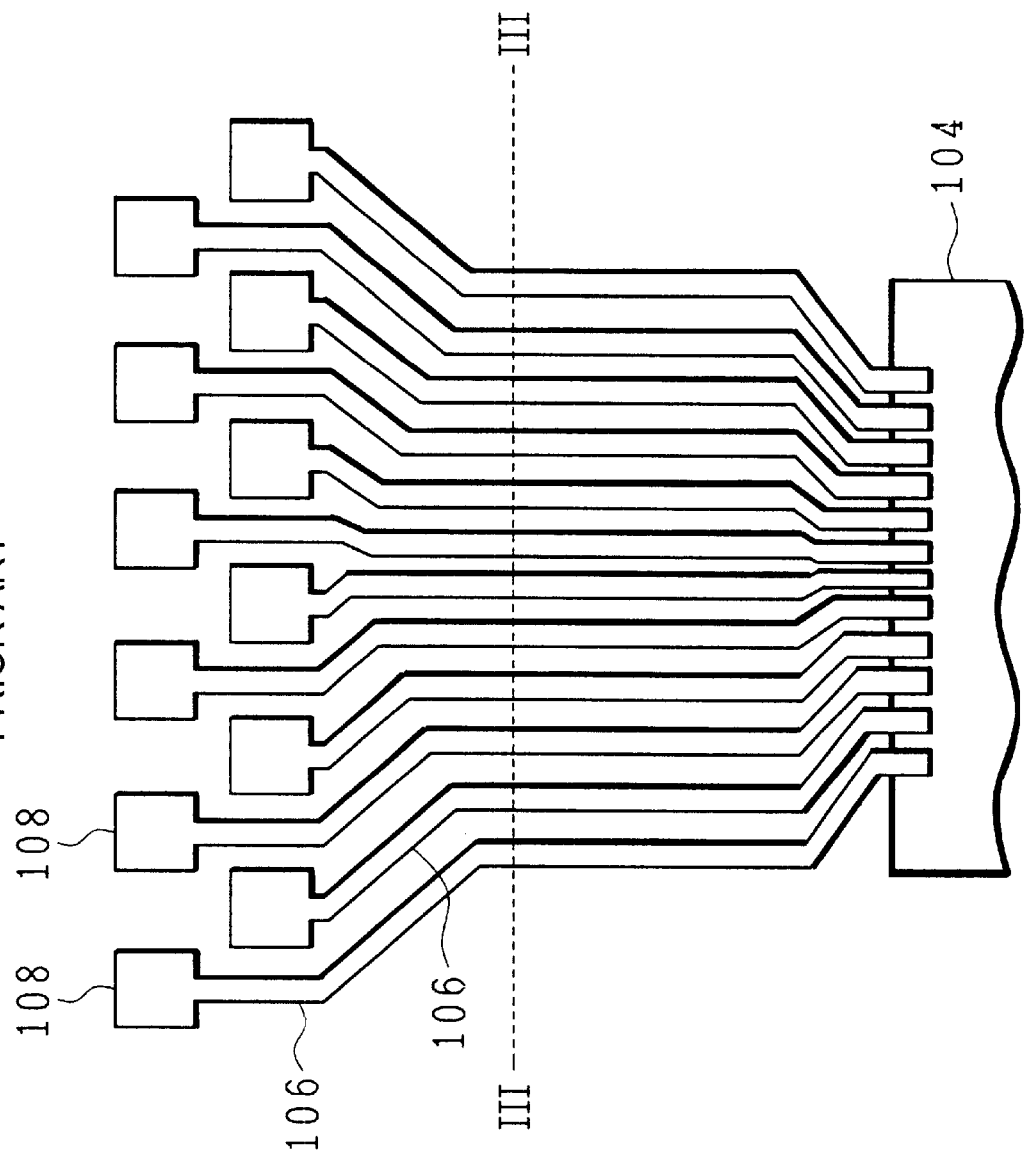
FIG. 14 is a plan view showing a lead terminal section of a second conventional film carrier tape.
Figure 15:
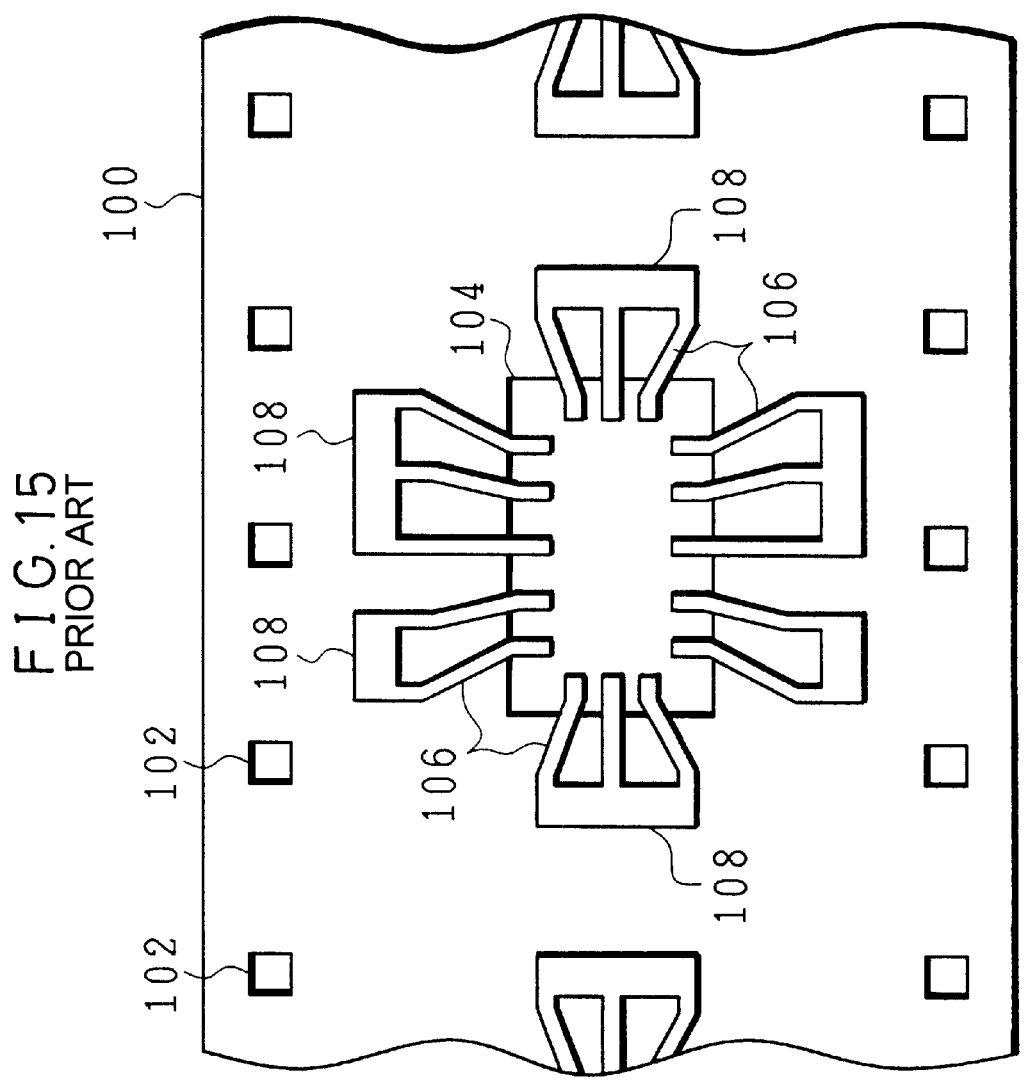
FIG. 15 is a plan view showing a third conventional film carrier tape.
Figure 16:
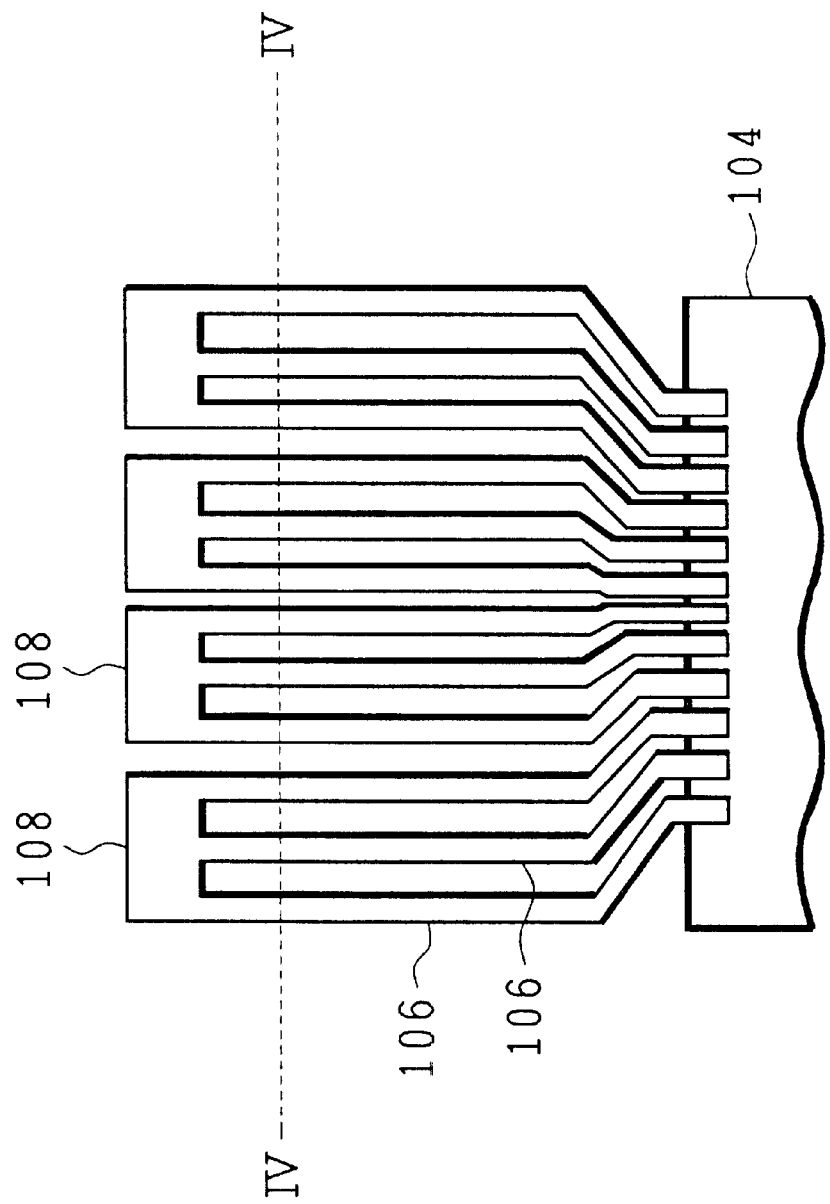
FIG. 16 is an enlarged view showing a lead terminal section of the film carrier tape shown in FIG. 15.
Figure 17:
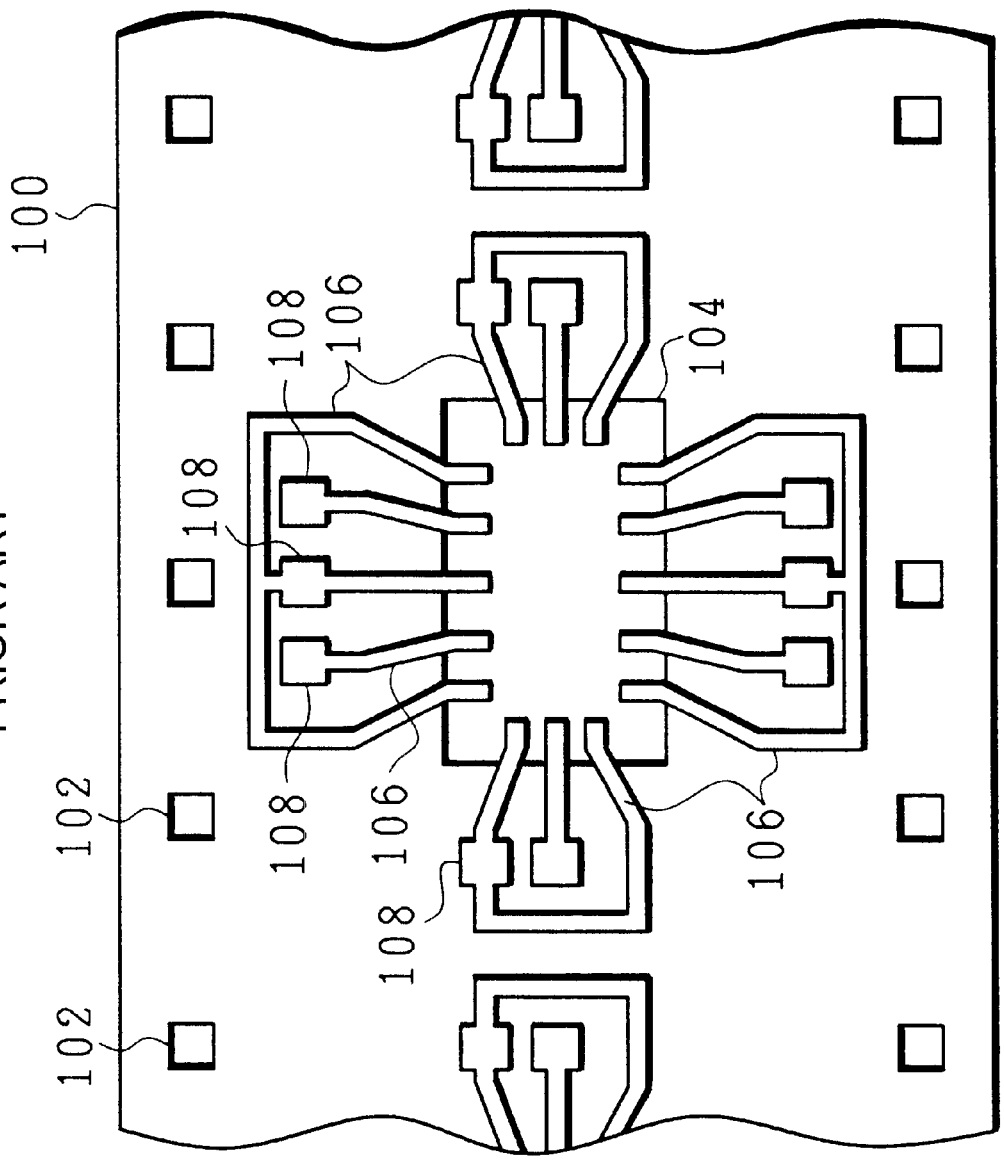
FIG. 17 is a plan view showing a fourth conventional film carrier tape.
Figure 18:
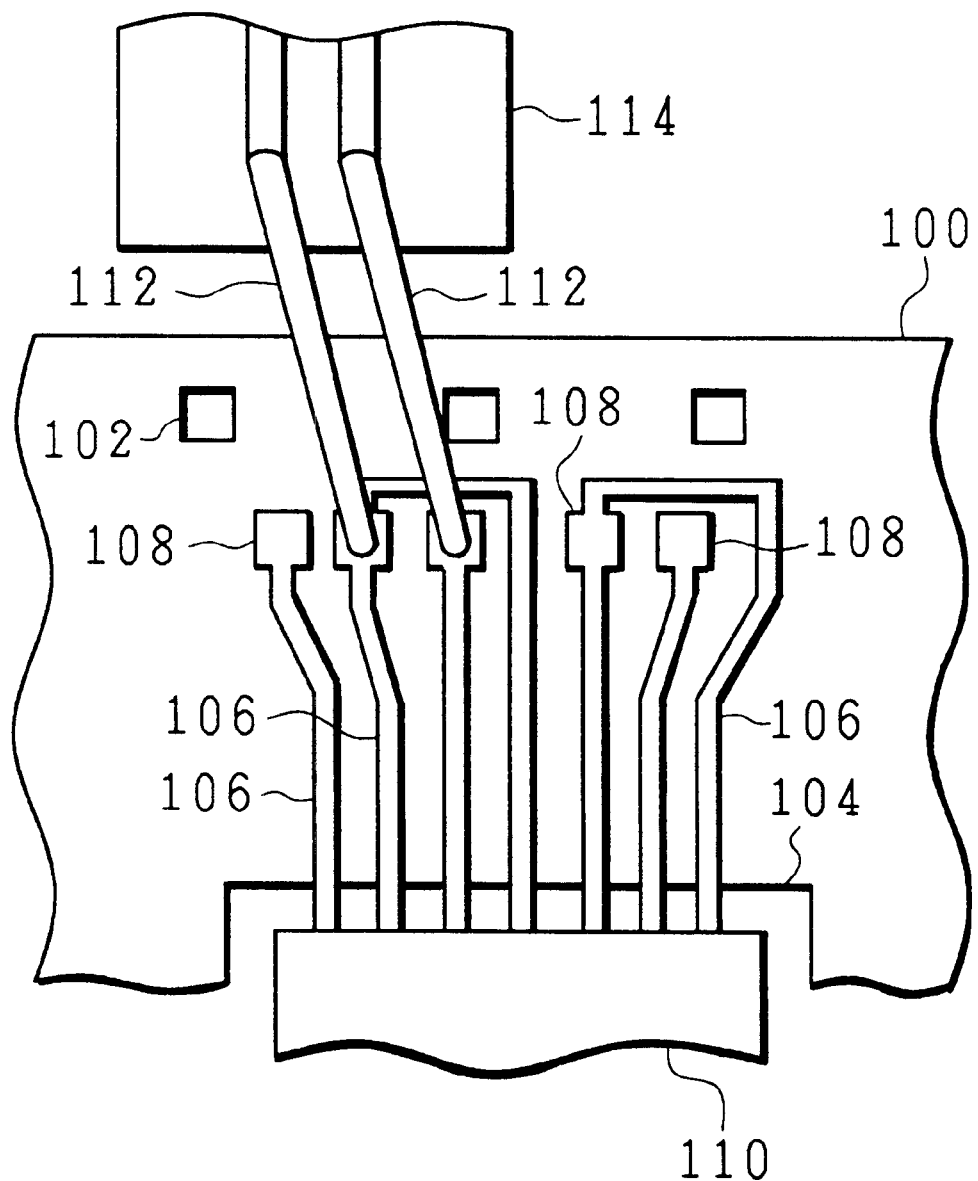
FIG. 18 is an explanatory view illustrating conventional delivery inspection conducted in the manufacturing process of the film carrier tape shown in FIG. 17, or more specifically an enlarged view showing a lead terminal section of the film carrier tape.

In light of the preceding description, FIG. 12 shows another embodiment of the present invention where the relative positioning of the electrical sorting pads 18A forming a single pad group are uniform throughout the insulating film 10.

In this embodiment, the electrical sorting pads 18A and 18B are probed simultaneously with respect to either the points a or c by means of a tester having many lead probes 26 (shown in FIG. 6) secured on the securing card 28 according to the coordinates of the electrical sorting pads 18A and 18B on the insulating film 10.

The lead terminal 16A-1 is first probed with the coordinates of the point a of the electrical sorting pad 18A as the target and evaluated for broken conductivity. Here, the lead probes 26 of the tester are arranged to touch the points a of all the electrical sorting pads 18A, and therefore the lead probes 26 can also touch the lead terminal 16A-3 separately. Hence, the lead terminal 16A-3 can be evaluated simultaneously for broken conductivity.

The lead terminals 16A-2 is subsequently probed with the coordinates of the point c of the electrical sorting pad 18A as the target and evaluated for broken conductivity. Here, the lead probes 26 of the tester are arranged to touch the points c of all the electrical sorting pads 18A, and therefore the lead probes 26 can also touch the lead terminal 16A-4 separately. Hence, the lead terminal 16A-4 can be evaluated simultaneously for broken conductivity.

Further, the lead probes 26 of the tester are also arranged to touch the electrical sorting pads 18B, and therefore, the lead terminals 16A and the non-grouped lead terminals 16B can be simultaneously evaluated for broken conductivity in either of the two evaluations above.

As detailed so far, with the present embodiments, the electrical sorting pads 18A having the same relative position in the respective pad groups can be probed simultaneously by means of a tester having many lead probes 26 secured on the securing card 28 according to the coordinates of the electrical sorting pads 18A and 18B on the insulating film 10. This enables the broken conductivity evaluation to be conducted with the minimum number of times that the lead probes 26 are adjusted in their position, and thus shortens the inspection process.

Here, it should be noted that in an electrical sorting test conducted later after the mounting of semiconductor chips, a probe should be conducted with the coordinates of the points b of the electrical sorting pads 18A on the insulating film 10 as the targets. This allows the lead terminals 16A connected to the electrical sorting pads 18A forming a single pad group to be mutually connected through a lead probe 22, and therefore enables the electrical sorting test to be conducted with less electrical sorting pads 18A after the mounting of semiconductor chips.

The film carrier tape in accordance with the present invention may include:

an insulating film;

a plurality of lead terminals that are each disposed on the insulating film and provided with an end connected to a semiconductor chip; and electrical sorting pads disposed at another end of each of the plurality of the lead terminals, wherein at least some of the electrical sorting pads are configured so as to form pad groups each composed of two or more of the electrical sorting pads, and the electrical sorting pads composing each of the pad groups are positioned adjacent to one another so as to simultaneously contact a measurement terminal of an electrical sorting tester and so as to be electrically separated from one another.

With the arrangement, at least some of the electrical sorting pads are configured so as to form pad groups each composed of two or more of the electrical sorting pads, and the electrical sorting pads composing each of the pad groups are positioned adjacent to one another so as to simultaneously contact a measurement terminal and also so as to be electrically separated from one another.

With the arrangement, in an inspection after the mounting of a semiconductor chip, if the measurement terminals of a tester are caused to simultaneously contact the electrical sorting pads forming the pad groups, two or more lead terminals can be electrically sorted simultaneously.

To be more specific, such simultaneous electrical sorting of two or more lead terminals becomes possible by connecting the lead terminals of the film carrier tape to the connection terminals of the semiconductor chip, then causing the measurement terminals of a tester to simultaneously contact the electrical sorting pads forming pad groups of the film carrier tape, and changing one of the connection terminals, of the semiconductor chip, which are connected to the electrical sorting pads forming pad groups through the lead terminals to a conductive state and the other to a non-conductive state, for example.

As a result, the electrical sorting pads forming a single pad group are capable of functioning as a single electrical sorting pad, and the electrical sorting pads can practically be reduced in number.

This holds down expansions of the area, of the insulating film, in which electrical sorting pads are disposed, and thereby effectively avoids increased production cost which would be otherwise caused by increased use of material of the insulating film.

Further, the tester used for an inspection after the mounting of a semiconductor chip needs less measurement terminals as a result of the reduction in the number of the electrical sorting pads. This solves the lack of measurement terminals of the tester used for an inspection after the mounting of a semiconductor chip.

Further, with the foregoing arrangement, since all the lead terminals can be electrically separated from one another, broken conductivity is detected for all the lead terminals by causing the measurement terminal of a tester to contact only one of the electrical sorting pads forming pad groups of the film carrier tape in a delivery inspection conducted in the manufacturing process of the film carrier tape.

The film carrier tape in accordance with the present invention may be configured so that the electrical sorting pad belonging to a pad group is disposed for every two or more lead terminals.

With the arrangement, if the measurement terminals of a tester are caused to simultaneously contact the electrical sorting pads forming a single pad group in an inspection conducted after the mounting of a semiconductor chip, the lead terminals connected to the electrical sorting pads forming the pad group can be electrically sorted simultaneously, and also adjacent lead terminals are kept electrically separated. Therefore, a short circuit can be detected between adjacent lead terminals in an inspection after the mounting of a semiconductor chip.

The film carrier tape in accordance with the present invention may be configured so that the electrical sorting pads forming a single pad group have a comb-like shape.

With the arrangement, the comb-like shape of the electrical sorting pads forming a single pad group allows those electrical sorting pads to better contact measurement terminals of a tester. Therefore, an electrical sorting can be more surely conducted on a plurality of lead terminals in an inspection after the mounting of a semiconductor chip.

The film carrier tape in accordance with the present invention may be configured so that the electrical sorting pads forming a single pad group have a spiral shape.

With the arrangement, the spiral shape of the electrical sorting pads forming a single pad group allows those electrical sorting pads to better contact measurement terminals of a tester. Therefore, an electrical sorting can be more surely conducted on a plurality of lead terminals in an inspection after the mounting of a semiconductor chip.

The film carrier tape in accordance with the present invention may be configured so that the electrical sorting pads composing a single group are relatively positioned in the same manner in all the pad groups.

With the arrangement, the electrical sorting pads that are placed on a certain side in each pad group can be probed simultaneously by means of a tester having many lead probes secured on the securing card according to the coordinates of the electrical sorting pads on the insulating film. This enables the broken conductivity evaluation to be conducted with the minimum number of times that the lead probes are adjusted in their position, and thus shortens the inspection process.

The method of evaluating a film carrier tape in accordance with the present invention may be such that a measurement terminal of a tester is caused to contact only one of the electrical sorting pads composing a single pad group of the film carrier tape in accordance with the present invention.

The method offers a method of evaluating a film carrier tape whereby all the lead terminals can be evaluated for broken conductivity in the manufacturing process of the film carrier tape (when delivered).

The method of evaluating a film carrier tape in accordance with the present invention may be such that after the lead terminals of the film carrier tape are connected to the respective connection terminals of the semiconductor chip, the measurement terminals of the tester are caused to simultaneously contact the electrical sorting pads composing each pad group, one of the connection terminals, of the semiconductor chip, connected to the respective electrical sorting pads forming each pad group through the lead terminals is changed to a conductive state, while the other connection terminal is changed to a non-conductive state.

The method enables a plurality of lead terminals to be simultaneously electrically sorted after the mounting of the semiconductor chip. Therefore, the electrical sorting pads forming a single pad group are capable of functioning as a single electrical sorting pad. As a result, the method can offer a method of evaluating a film carrier tape whereby the tester used in an inspection conducted after the mounting of the semiconductor chip needs less measurement terminals.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A film carrier tape, comprising:

a plurality of lead terminals that are each disposed on an insulating film and provided with an end connected to a semiconductor chip and another end having an electrical sorting pad, wherein the electrical sorting pads of two or more of the plurality of lead terminals that are not adjacent to one another are made up of a plurality of electrical sorting pads which are electrically separated from one another, and wherein a total area of the plurality of electrical sorting pads is substantially equal to an area of an adjacent electrical sorting pad.

2. The film carrier tape as set forth in claim 1, wherein the electrical sorting pads of two or more of the plurality of lead terminals that are not adjacent to one another are configured so as to simultaneously contact a measurement terminal of an electrical sorting tester, and also so that only one of the electrical sorting pads contact a measurement terminal of a broken conductivity inspection tester.

3. A film carrier tape, comprising:

a plurality of lead terminals that are each disposed on an insulating film and provided with an end connected to a semiconductor chip and another end having an electrical sorting pad, wherein the electrical sorting pads of two or more of the plurality of lead terminals that are not adjacent to one another are made up of a plurality of electrical sorting pads which are electrically separated from one another, and wherein a total area of the plurality of electrical sorting pads is substantially equal to an area of an adjacent electrical sorting pad.

4. The film carrier tape as set forth in claim 3, wherein the electrical sorting pads of two or more of the plurality of lead terminals that are not adjacent to one another are configured so as to simultaneously contact a measurement terminal of an electrical sorting tester and so as to be electrically separated from one another, and so that a measurement terminal of a broken conductivity inspection tester contacts only one of the electrical sorting pads.

5. The film carrier tape as set forth in claim 4, wherein the electrical sorting pads of two or more of the plurality of lead terminals that are not adjacent to one another have a spiral shape.

6. The film carrier tape as set forth in claim 4, wherein the electrical sorting pads of two or more of the plurality of lead terminals that are not adjacent to one another have a comb-like shape.

7. The film carrier tape as set forth in claim 5, wherein the broken conductivity inspection tester includes non-contact voltage detection means to conduct broken conductivity inspection by detecting, when a voltage is applied at an end of each of the two or more of the plurality of lead terminals, a voltage at the other end of each of the two or more of the plurality of lead terminals in a non-contact manner with the non-contact voltage detection means.

8. The film carrier tape as set forth in claim 6, wherein the broken conductivity inspection tester includes non-contact voltage detection means to conduct broken conductivity inspection by detecting, when a voltage is applied at an end of each of the two or more of the plurality of lead terminals, a voltage at the other end of each of the two or more of the plurality of lead terminals in a non-contact manner with the non-contact voltage detection means.

9. A film carrier tape, comprising:

an insulating film;

a plurality of lead terminals that are each disposed on the insulating film and provided with one end connected to a semiconductor chip; and electrical sorting pads disposed at another end of each of the plurality of the lead terminals, wherein at least some of the electrical sorting pads are configured so as to form pad groups each composed of two or more of the electrical sorting pads, wherein a total area of said pad groups is substantially equal to an area of an adjacent electrical sorting pad that is not part of a pad group, and wherein the electrical sorting pads composing each of the pad groups are positioned adjacent to one another so as to simultaneously contact a measurement terminal of an electrical sorting tester, and so as to be electrically separated from one another.

10. The film carrier tape as set forth in claim 9, wherein the electrical sorting pads composing each of the pad groups form a region where the electrical sorting pads are separated from one another by a distance shorter than a maximum width of the measurement terminal measured parallel to a contact plane on which the measurement terminal of the electrical sorting tester contacts the pads.

11. The film carrier tape as set forth in claim 9, wherein the electrical sorting pads composing each of the pad groups each have a right-angled isosceles triangle shape, and when viewed including the space separating one another, have the same shape and area as the electrical sorting pad that does not belong to a pad group.

12. The film carrier tape as set forth in claim 9, wherein some of the pad groups are composed of three or more of the plurality of the electrical sorting pads.

13. The film carrier tape as set forth in claim 9, wherein the electrical sorting pads composing each of the pad groups are relatively positioned in the same manner in all the pad groups.

* * * * *